(12) United States Patent
Sugawara et al.

(10) Patent No.: US 12,428,611 B2
(45) Date of Patent: *Sep. 30, 2025

(54) CLEANING LIQUID USED FOR CLEANING METAL RESISTS, AND CLEANING METHOD USING CLEANING LIQUID

(71) Applicant: TOKYO OHKA KOGYO CO., LTD., Kawasaki (JP)

(72) Inventors: Mai Sugawara, Kawasaki (JP); Tomoya Kumagai, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 437 days.

This patent is subject to a terminal disclaimer.

(21) Appl. No.: 18/062,226

(22) Filed: Dec. 6, 2022

(65) Prior Publication Data

US 2023/0183617 A1 Jun. 15, 2023

(30) Foreign Application Priority Data

Dec. 14, 2021 (JP) ................. 2021-202506

(51) Int. Cl.
| | |
|---|---|
| C23G 1/02 | (2006.01) |
| B08B 3/04 | (2006.01) |
| B08B 3/08 | (2006.01) |
| C11D 7/08 | (2006.01) |
| C11D 7/26 | (2006.01) |
| C11D 7/50 | (2006.01) |
| H01L 21/02 | (2006.01) |

(52) U.S. Cl.
CPC ............. *C11D 7/08* (2013.01); *C11D 7/265* (2013.01); *H01L 21/02087* (2013.01); *C11D 2111/22* (2024.01)

(58) Field of Classification Search
CPC ....... C11D 7/08; C11D 7/265; C11D 2111/22; H01L 21/02087
See application file for complete search history.

(56) References Cited

U.S. PATENT DOCUMENTS

| | | | |
|---|---|---|---|
| 9,176,377 | B2 | 11/2015 | Stowers et al. |
| 2004/0202967 | A1 | 10/2004 | Park et al. |
| 2009/0085017 | A1 | 4/2009 | Nemoto |
| 2010/0048443 | A1 | 2/2010 | Ohwada |
| 2020/0326629 | A1* | 10/2020 | Kumagai .......... H01L 21/02087 |
| 2020/0326631 | A1 | 10/2020 | Kumagai et al. |
| 2022/0252987 | A1 | 8/2022 | Yamada |

FOREIGN PATENT DOCUMENTS

| | | | |
|---|---|---|---|
| JP | 10-282682 A | | 10/1998 |
| JP | 2001-188359 A | | 7/2001 |
| JP | 2004165447 A | * | 6/2004 |
| JP | 2004-310052 A | | 11/2004 |
| JP | 2006-163022 A | | 6/2006 |
| JP | 2008-107494 A | | 5/2008 |
| JP | 2009-085976 A | | 4/2009 |
| JP | 2013-101224 A | | 5/2013 |
| JP | 2014-240948 A | | 12/2014 |
| JP | 2020-173359 A | | 10/2020 |
| KR | 10-2011-0077734 A | | 7/2011 |
| WO | WO 2018/031896 A1 | | 2/2018 |
| WO | WO 2021/020503 A1 | | 2/2021 |

OTHER PUBLICATIONS

"Safety Data Sheet: Sulfuric acid, 5% w/w Food Grade" Columbus Chemical Industries. Dec. 13, 2021 (Year: 2021).*
Office Action issued in Japanese Patent Application No. 2021-202506, mailed Feb. 22, 2022.
Decision of Rejection issued in Japanese Patent Application No. 2021-202506, mailed Jun. 14, 2022.
Office Action issued in Japanese Patent Application No. 2021-202511, mailed Feb. 22, 2022, in 3 pages.
Office Action issued in U.S. Appl. No. 18/062,841, dated Apr. 18, 2025, in 12 pages.

* cited by examiner

*Primary Examiner* — Lorna M Douyon
*Assistant Examiner* — Brittany Sharon Harris
(74) *Attorney, Agent, or Firm* — KNOBBE, MARTENS, OLSON & BEAR, LLP

(57) ABSTRACT

A metal resist remover containing a solvent and a sulfuric acid, in which a pH value, which is measured with a pH meter, of a liquid formed by subjecting the cleaning liquid to a 10-fold dilution with pure water is 2.5 or less.

9 Claims, No Drawings

CLEANING LIQUID USED FOR CLEANING METAL RESISTS, AND CLEANING METHOD USING CLEANING LIQUID

BACKGROUND OF THE INVENTION

Field of the Invention

The present invention relates to a cleaning liquid used for cleaning metal resists, and a cleaning method using the cleaning liquid.

Priority is claimed on Japanese Patent Application No. 2021-202506, filed on Dec. 14, 2021, the content of which is incorporated herein by reference.

Description of Related Art

The processing of semiconductor circuits and devices have been accompanied by a continual minification in critical dimensions over each generation. In accordance with the minification of these dimensions, new materials and methods are sought to meet the demands of processing and patterning more fine structures.

Patterning formation generally includes selective exposure of a thin layer of a radiation-sensitive material (resist) to subsequently form a pattern that is transferred to layers or functional materials. Metal resists suitable for providing favorable absorption of extreme ultraviolet (EUV) and electron beam (EB) while providing very high etching contrast at the same time have been proposed (refer to Patent Document 1, for example).

In patterning using such a metal resist, ligands coordinated to metal peroxides in the metal resist are decomposed by exposure, and hydrolysis and condensation proceed to form metal oxides, thereby making the resist insoluble in a developing solution. Subsequently, by developing the resist, a pattern with high etching resistance is formed. However, in the patterning using a metal resist, when the metal resist is applied onto a substrate such as a silicon wafer, clusters of metal peroxides may bond to the surface of the substrate, which generates residues.

In order to remove such residues, it has been proposed to use a cleaning liquid containing an organic solvent and a carboxylic acid (refer to Patent Document 2, for example).

CITATION LIST

Patent Documents

[Patent Document 1] U.S. Pat. No. 9,176,377
[Patent Document 2] WO2018/031896

SUMMARY OF THE INVENTION

As a result of studies by the inventors of the present invention, it was found that when a support having a metal resist is cleaned using a cleaning liquid containing an organic solvent and a solid acid such as oxalic acid or benzenesulfonic acid, high metal removing properties can be exhibited, but there is a probability of contaminating a process apparatus because the solid acid precipitates when the cleaning liquid is dried, causing an organic substance to remain on a treated surface.

On the other hand, as a result of studies by the inventors of the present invention, it was found that when a liquid acid such as acetic acid is used instead of a solid acid such as oxalic acid to prevent precipitation at the time of drying, metal removing properties are insufficient compared to when a solid acid such as oxalic acid is used.

The present invention has been made in view of the above-mentioned circumstances, and an object thereof is to provide a cleaning liquid, which is used for cleaning metal resists and in which metal removing properties are improved and an organic substance residual amount is reduced, and a cleaning method using the cleaning liquid.

In order to achieve the above-mentioned object, the present invention adopts the following constitution.

A first aspect of the present invention is a cleaning liquid which is used for cleaning metal resists, the cleaning liquid containing: a solvent; and a sulfuric acid, in which a pH value, which is measured with a pH meter, of a liquid formed by subjecting the above-mentioned cleaning liquid to a 10-fold dilution with pure water is 2.5 or less.

A second aspect of the present invention is a cleaning method including a step of cleaning an object to which a metal resist is attached using the above-mentioned cleaning liquid according to the first aspect.

According to the present invention, a cleaning liquid, which is used for cleaning metal resists and in which metal removing properties are improved and an organic substance residual amount is reduced, and a cleaning method using the cleaning liquid can be provided.

DETAILED DESCRIPTION OF THE INVENTION (Cleaning Liquid)

A cleaning liquid (also referred to as "metal resist remover") according to the first aspect of the present invention contains a solvent and a sulfuric acid. The cleaning liquid according to the present aspect is used for cleaning metal resists.

In the cleaning liquid of the present embodiment, the pH value, which is measured with a pH meter, of a liquid formed by subjecting the cleaning liquid to a 10-fold dilution with pure water is 2.5 or less, preferably 2.4 or less, more preferably 2.3 or less, further preferably 2.2 or less, and particularly preferably 2.1 or less.

When the pH value, which is measured with a pH meter, of the liquid formed by subjecting the cleaning liquid to a 10-fold dilution with pure water is 2.5 or less, the metal removing properties of the cleaning liquid are easily improved. Although there is no particular limitation, the lower limit value may be a negative value, and is preferably adjusted appropriately according to the process environment in the system using the cleaning liquid of the present embodiment. For example, the lower limit value is 0.1 or more, preferably 1.0 or more, and more preferably 1.4 or more.

In the present embodiment, the above-mentioned pH value is a value measured at room temperature.

<Solvent>

Examples of the solvent include, but are not limited to, water and organic solvents.

Examples of the organic solvents include glycol ethers such as propylene glycol methyl ether (PGME), propylene glycol methyl ethyl acetate (PGMEA), propylene glycol butyl ether (PGBE), and ethylene glycol methyl ether, and esters thereof; alcohols such as ethanol, propanol, isopropyl alcohol, isobutyl alcohol, hexanol, ethylene glycol, and propylene glycol; cyclic esters such as γ-butyrolactone; esters such as n-butyl acetate and ethyl acetate; ketones such as 2-heptanone; liquid cyclic carbonates such as propylene carbonate and butylene carbonate; and cyclic sulfones such as sulfolane.

Among them, the solvent is preferably an organic solvent not having a hydroxyl group, is more preferably a glycol ether and its ester or ketone, is further preferably propylene glycol methyl ethyl acetate (PGMEA) or 2-heptanone, and is particularly preferably propylene glycol methyl ethyl acetate (PGMEA).

By using an organic solvent not having a hydroxyl group as the solvent, the esterification reaction of the acid (sulfuric acid) in the cleaning liquid is easily prevented, and the temporal stability of the cleaning liquid is easily improved.

In present embodiment, for the solvent, one type may be used alone, or a mixed solvent of two or more types may be used.

In the cleaning liquid according to the present embodiment, the content of the solvent with respect to the total mass (100% by mass) of the cleaning liquid is preferably 30% to 99.95% by mass, more preferably 35% to 99.9% by mass, and further preferably 40% to 99.7% by mass.

When the content of the solvent is within the above-mentioned preferable range, the metal removing properties of the cleaning liquid are easily improved.

When the cleaning liquid according to the present embodiment contains water as the solvent, the content of water with respect to the total mass (100% by mass) of the cleaning liquid is preferably 30% by mass or less, more preferably 25% by mass or less, and further preferably 20% by mass or less. The lower limit value of the content of water is not particularly limited, but for example, it may be 0.01% by mass or more, may be 0.05% by mass or more, or may be 0.1% by mass or more with respect to the total mass (100% by mass) of the cleaning liquid.

When the content of water is within the above-mentioned preferable range, the metal removing properties of the cleaning liquid are easily improved.

<Sulfuric Acid>

Sulfuric acid is not particularly limited, and commercially available products can be used.

In the cleaning liquid according to the present embodiment, the content of the sulfuric acid with respect to the total mass (100% by mass) of the cleaning liquid is preferably 0.05% to 3% by mass, more preferably 0.1% to 3% by mass, and further preferably 0.3% to 3% by mass.

When the content of the sulfuric acid is within the above-mentioned preferable range, the metal removing properties of the cleaning liquid are easily improved.

<Other Components>

The cleaning liquid according to the present aspect may contain other components (hereinafter also referred to as "additives") in addition to the above-mentioned components within a range not impairing the effect of the present invention.

Examples of the additives include organic acids other than sulfuric acid, inorganic hydrofluoric acid, tetraalkylammonium compounds, and surfactants.

Examples of the organic acids include carboxylic acids such as acetic acid, formic acid, citric acid, oxalic acid, 2-nitrophenylacetic acid, 2-ethylhexanoic acid, and dodecanoic acid; sugar acids such as ascorbic acid, tartaric acid, glucuronic acid; sulfonic acids such as benzenesulfonic acid and p-toluenesulfonic acid; and phosphoric acid esters such as bis(2-ethylhexyl) phosphate, where organic acids, which are liquid at room temperature, such as acetic acid, formic acid, 2-ethylhexanoic acid, glucuronic acid, and bis(2-ethylhexyl) phosphate are preferable.

Examples of the inorganic hydrofluoric acid include hexafluorosilicic acid, hexafluorophosphoric acid, and fluoroboric acid.

Examples of the tetraalkylammonium compounds include tetramethylammonium fluoride, tetrabutylammonium fluoride, and tetrabutylammonium fluorosilicate.

Examples of the surfactants include polyalkylene oxide alkylphenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzyl phenyl ether-based surfactants, and acetylene polyalkylene oxide-based surfactants.

Among them, acetic acid is preferable as the additive.

For each additive, one type may be used alone, or two or more types may be used in combination.

When the cleaning liquid according to the present embodiment contains the additive, the content of the additive with respect to the total mass (100% by mass) of the cleaning liquid is preferably 1% to 60% by mass, more preferably 1% to 50% by mass, and further preferably 1% to 45% by mass.

When the cleaning liquid of the present embodiment contains an acetic acid as the additive, the content of the acetic acid with respect to the total mass of the cleaning liquid is preferably 30% to 40% by mass, more preferably 35% to 40% by mass, and further preferably 37% to 40% by mass.

When the content of the acetic acid is within the above-mentioned preferable range, the metal removing properties of the cleaning liquid are easily improved.

The cleaning liquid of the present embodiment may be a cleaning liquid (hereinafter also referred to as "cleaning liquid A") which is composed only of the solvent, a sulfuric acid, and unavoidable impurities.

In the cleaning liquid A, the content of the solvent with respect to the total mass (100% by mass) of the cleaning liquid A is preferably 97% to 99.95% by mass, more preferably 97% to 99.9% by mass, further preferably 97% to 99.7% by mass, and particularly preferably 98.5% to 99.5% by mass.

Furthermore, in the cleaning liquid A, the content of the sulfuric acid with respect to the total mass (100% by mass) of the cleaning liquid A is preferably 0.05% to 3% by mass, more preferably 0.1% to 3% by mass, further preferably 0.3% to 3% by mass, and particularly preferably 0.5% to 1.5% by mass.

When the contents of the solvent and the sulfuric acid in the cleaning liquid A are within the above-mentioned preferable ranges, the metal removing properties of the cleaning liquid are easily improved.

The cleaning liquid of the present embodiment may be a cleaning liquid (hereinafter also referred to as "cleaning liquid B") which is composed only of the solvent, a sulfuric acid, an acetic acid, and unavoidable impurities.

In the cleaning liquid B, the content of the solvent with respect to the total mass (100% by mass) of the cleaning liquid B is preferably 45% to 80% by mass, more preferably 50% to 75% by mass, further preferably 55% to 70% by mass, and particularly preferably 58% to 65% by mass.

In addition, in the cleaning liquid B, the content of the sulfuric acid with respect to the total mass (100% by mass) of the cleaning liquid B is preferably 0.05% to 3% by mass, more preferably 0.1% to 3% by mass, and further preferably 0.3% to 3% by mass.

In addition, in the cleaning liquid B, the content of the acetic acid with respect to the total mass (100% by mass) of the cleaning liquid B is preferably 30% to 40% by mass, more preferably 35% to 40% by mass, and further preferably 37% to 40% by mass.

When the contents of the solvent, the sulfuric acid, and the acetic acid in the cleaning liquid B are within the above-mentioned preferable ranges, the metal removing properties of the cleaning liquid are easily improved.

When the cleaning liquid B contains water as the solvent, the content of water with respect to the total mass (100% by mass) of the cleaning liquid B is preferably 30% by mass or less, more preferably 25% by mass or less, and further preferably 20% by mass or less. The lower limit value of the content of water is not particularly limited, but for example, it may be 0.01% by mass or more, may be 0.05% by mass or more, or may be 0.1% by mass or more with respect to the total mass (100% by mass) of the cleaning liquid B.

When the content of water in the cleaning liquid B is within the above-mentioned preferable range, the metal removing properties of the cleaning liquid are easily improved.

The cleaning liquid of the present embodiment may not contain at least one selected from the group consisting of carboxylic acids such as acetic acid, formic acid, citric acid, oxalic acid, 2-nitrophenylacetic acid, 2-ethylhexanoic acid, and dodecanoic acid; sugar acids such as ascorbic acid, tartaric acid, and glucuronic acid; sulfonic acids such as benzenesulfonic acid and p-toluenesulfonic acid; phosphoric acid esters such as bis(2-ethylhexyl) phosphate; organic acids such as hexafluorosilicic acid, hexafluorophosphoric acid, and fluoroboric acid; tetraalkylammonium compounds such as tetramethylammonium fluoride, tetrabutylammonium fluoride, and tetrabutylammonium fluorosilicate; and surfactants such as polyalkylene oxide alkylphenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzyl phenyl ether-based surfactants, and acetylene polyalkylene oxide-based surfactants.

<Metal Resist>

The cleaning liquid according to present embodiment is used for cleaning metal resists.

The metal resist is not particularly limited, and examples thereof include those containing at least one metal selected from the group consisting of Sn, Bi, Hf, Zr, In, Te, Sb, Ni, Co, Ti, W, Ta, and Mo.

According to the cleaning liquid of the present embodiment described above, since a sulfuric acid is incorporated as an acid component, the metal removing properties are improved, and precipitation at the time of drying is prevented, thereby reducing an organic substance residual amount.

Since a sulfuric acid is liquid at room temperature, it does not precipitate when dried unlike solid acids such as oxalic acid and benzenesulfonic acid. In addition, a sulfuric acid is incorporated such that the pH value, which is measured with a pH meter, of the liquid formed by subjecting the cleaning liquid of the present embodiment to a 10-fold dilution with pure water is 2.5 or less, thereby obtaining sufficient metal removing properties.

Furthermore, because a sulfuric acid has a lower pKa than acetic acid, sufficient metal removing properties are obtained.

Therefore, by using the cleaning liquid of the present embodiment, favorable metal removing properties can be exhibited while preventing contamination of a process apparatus.

The cleaning liquid of the present embodiment may contain no high-pressure fluid.

(Cleaning Method)

A second aspect of the present invention is a cleaning method including a step (hereinafter sometimes simply referred to as a "cleaning step") of cleaning an object to which a metal resist is attached using the above-mentioned cleaning liquid according to the first aspect.

The object to which a metal resist is attached is not particularly limited, but examples thereof include a support having a metal resist, and a process apparatus to which a metal resist is attached. Among them, the support having a metal resist is preferable as the object to which a metal resist is attached.

The support is not particularly limited, and a conventionally known one can be used. Examples thereof include a substrate for electronic components, and one obtained by forming a predetermined wiring pattern on this substrate. More specific examples thereof include silicon wafers, substrates made of metals such as copper, chromium, iron, and aluminum, and glass substrates.

The metal resist is the same as the metal resist described in the above-mentioned cleaning liquid according to the first aspect.

Although a method for forming the metal resist is not particularly limited, a metal resist and a patterning method can be used, which are disclosed in, for example, U.S. Pat. No. 9,176,377 B2, United States Patent Application, Publication No. 2013/0224652, U.S. Pat. No. 9,310,684, United States Patent Application, Publication No. 2016/0116839, Jiang, Jing; Chakrabarty, Souvik; Yu, Mufei; et al., "Metal Oxide Nanoparticle Photoresists for EUV Patterning", Journal Of Photopolymer Science And Technology 27(5), 663-6662014, A Platinum-Fullerene Complex for Patterning Metal Containing Nanostructures, D. X. Yang, A. Frommhold, D. S. He, Z. Y. Li, R. E. Palmer, M. A. Lebedeva, T. W. Chamberlain, A. N. Khlobystov, A. P. G. Robinson, Proc SPIE Advanced Lithography, 2014, United States Patent Application, Publication No. 2009/0155546, U.S. Pat. No. 6,566,276, and the like.

In addition, as the method for forming a metal resist, a method for forming a film by depositing a metal oxide-containing film on a support by vapor phase growth or the like disclosed in Japanese Unexamined Patent Application, First Publication No. 2015-201622, Japanese Unexamined Patent Application, First Publication No. 2020-84330, and the like may be used.

In present embodiment, the cleaning step is not particularly limited, and examples thereof include known cleaning methods in semiconductor manufacturing processes such as edge bead removal and back rinsing.

In the present embodiment, the cleaning step preferably includes applying the cleaning liquid according to the first aspect along the circumferential edge portion of the support to remove (hereinafter sometimes referred to as "edge rinsing") edge beads on the support having a metal resist.

An edge rinsing method is not particularly limited as long as it is a conventionally known process, and examples thereof include a method disclosed in PCT International Publication No. WO2018/031896.

The number of times of the edge rinsing is not particularly limited, and the edge rinsing can be performed 1 to 20 times. Furthermore, two or more types of cleaning liquid can be applied during the edge rinsing.

In the edge rinsing, the cleaning liquid can be added dropwise in the amount of preferably 0.05 to 50 mL, more preferably 0.075 to 40 mL, and further preferably 0.1 to 25 mL.

As another embodiment, in the edge rinsing, the cleaning liquid may be sprayed for preferably 1 second to 5 minutes and more preferably 5 seconds to 2 minutes at the flow rate of preferably 5 mL/min to 50 mL/min.

To evaluate the metal removing properties by the edge rinsing, the support can be inspected for residual metal. Suitable commercially available approaches for the evaluation of a trace amount of metal generally include inductively coupled plasma-mass spectrometry (ICP-MS). For evaluation of the support surface, vapor phase decomposition-inductively coupled plasma-mass spectrometry (VPD-ICP-MS) can be used. Using this technique, residual metal per unit area of a wafer surface along the edge portion can be determined.

In the present embodiment, when the metal resist is an Sn-based resist, the amount of residual Sn is preferably $60\times10^{10}$ atoms/cm$^2$ or less, more preferably $50\times10^{10}$ atoms/cm$^2$ or less, further preferably $40\times10^{10}$ atoms/cm$^2$ or less, and particularly preferably $30\times10^{10}$ atoms/cm$^2$ or less.

According to the cleaning method according to the present embodiment described above, cleaning the object to which a metal resist is attached is performed, using the cleaning liquid containing the solvent and a sulfuric acid. In the cleaning liquid, the metal removing properties are improved, and precipitation at the time of drying is prevented, thereby reducing the organic substance residual amount. Therefore, favorable metal removing properties can be exhibited while preventing contamination of a process apparatus.

EXAMPLES

The present invention will be described in more detail below with reference to examples, but the present invention is not limited to these examples.

<Preparation (1) of Cleaning Liquid>

Examples 1 to 6 and Comparative Examples 1 to 6

Each component shown in Table 1 was mixed to prepare a cleaning liquid of each example.

In Table 1, each abbreviation has the following meaning. In addition, the numerical value is a blending amount (% by mass).

The pH values of the cleaning liquids of Examples 1 to 4 and Comparative Examples 1 to 6 were pH values, which were measured with a pH meter, of a liquid formed by subjecting each of the cleaning liquids to a 10-fold dilution with pure water. The pH values of the cleaning liquids of Examples 5 and 6 were pH values measured directly with a pH meter without diluting the cleaning liquids.

PGMEA: propylene glycol methyl ethyl acetate.

PM/PE: a mixed solvent of propylene glycol methyl ethyl acetate/propylene glycol monomethyl ether=3/7.

<Evaluation (1) of Sn removing properties 1.5 mL of an organometallic tin oxyhydroxide resist (manufactured by Inpria corporation) was applied onto a Si wafer, and a Sn resist film was formed by spin coating under the application conditions of 2,000 rpm and 60 seconds.

Subsequently, 25 mL of the cleaning liquid of each of the examples was applied onto the Si wafer on which the Sn resist film was formed, and the wafer was rotated at 500 rpm for 25 seconds until the cleaning liquid was dried. Thereafter, 5 mL of a mixed solution of propylene glycol methyl ether (PGME) and propylene glycol methyl ethyl acetate (PGMEA) in the mass ratio of 7/3 was applied to perform post-rinsing by rotating the wafer at 500 rpm for 60 seconds until the mixed solution was dried.

Subsequently, the amount of residual Sn (×10$^{10}$ atoms/cm$^2$) was measured by Chem Trace (registered trademark) using vapor phase decomposition-inductively coupled plasma-mass spectrometry (VPD-ICP-MS). With the amount of residual Sn in the cleaning liquid of Comparative

TABLE 1

|  | Solvent | Acetic acid | Sulfuric acid | Other components | pH |
|---|---|---|---|---|---|
| Comparative Example 1 | PGMEA 60.00% | 39.5% | — | 0.5% of oxalic acid | 2.19 |
| Comparative Example 2 | PGMEA 60.00% | 38.0% | — | 2% of 2-ethylhexanoic acid | 2.59 |
| Comparative Example 3 | PM/PE 100% | — | — | — | Not measured |
| Comparative Example 4 | PGMEA 60.00% | 40.0% | — | — | 2.64 |
| Example 1 | PGMEA 60.00% | 39.5% | 0.5% | — | 2.01 |
| Comparative Example 5 | PGMEA 60.00% | 39.5% | — | 0.5% of benzenesulfonic acid | 1.95 |
| Comparative Example 6 | PGMEA 98.00% | — | — | 2% of 2-ethylhexanoic acid | 2.98 |
| Example 2 | PGMEA 60.00% | 39.0% | 1.0% | — | 1.77 |
| Example 3 | PGMEA 99.00% | — | 1.0% | — | 1.89 |
| Example 4 | PGMEA 60.00% | 38.0% | 2.0% | — | 1.51 |
| Example 5 | PGMEA 59.70% | 39.30% | 0.50% | 0.5% of water | (−2.00) |
| Example 6 | PGMEA 48.00% | 31.60% | 0.40% | 20% of water | (0.41) |

Example 4 taken as a reference value of 100, the relative value was used for the evaluation of the amount of residual Sn. Table 2 shows the 20 results.

<Evaluation (1) of Organic Substance Residual Amount>

The surface of a substrate after cleaning was visually confirmed, and the film thickness of a metal resist layer on the substrate after cleaning was measured using spectral ellipsometry to evaluate the presence or absence of a residual organic substance on the substrate.

TABLE 2

|  | Amount of residual Sn | Residual organic substance |
|---|---|---|
| Comparative Example 1 | 16 | Presence |
| Comparative Example 2 | 137 | — |
| Comparative Example 3 | 1626 | — |
| Comparative Example 4 | 100 | — |
| Example 1 | 16 | Absence |
| Comparative Example 5 | 30 | Presence |
| Comparative Example 6 | 340 | — |
| Example 2 | 11 | Absence |
| Example 3 | 18 | Absence |
| Example 4 | 12 | Absence |
| Example 5 | 21 | Absence |
| Example 6 | 25 | Absence |

From the results shown in Table 2, it was confirmed that in the cleaning liquids of Examples 1 to 6, the amount of residual Sn was smaller than that of the cleaning liquid of Comparative Example 4, showing favorable metal removing properties. It was also confirmed that in the cleaning liquids of Examples 1 to 6, the amount of residual organic substances was reduced.

<Preparation (2) of Cleaning Liquid>

Examples 7 to 9

60% by mass of propylene glycol methyl ethyl acetate, 39.5% of acetic acid, and 0.5% of sulfuric acid were mixed to prepare cleaning liquids of Examples 7 to 9. In the cleaning liquids of Examples 7 to 9, the pH value, which was measured with a pH meter, of a liquid formed by subjecting each of the cleaning liquids to a 10-fold dilution with pure water was 2.03.

<Evaluation (2) of Sn Removing Properties>

The cleaning liquids of Examples 7 to 9 were used for the evaluation of the amount of residual Sn in the same manner as in <Evaluation (1) of Sn removing properties> described above.

In Example 7, the amount of residual Sn was evaluated in the same manner as in <Evaluation (1) of Sn removing properties> described above except that post-rinsing was performed for 10 seconds.

In Example 8, the amount of residual Sn was evaluated in the same manner as in <Evaluation (1) of Sn removing properties> described above except that post-rinsing was performed using methyl isobutyl carbinol (MIBC) instead of the mixed solution of propylene glycol methyl ether (PGME) and propylene glycol methyl ethyl acetate (PGMEA) in the mass ratio of 7/3.

In Example 9, the amount of residual Sn was evaluated in the same manner as in <Evaluation (1) of Sn removing properties> described above except that post-rinsing was performed using 1-butanol instead of the mixed solution of propylene glycol methyl ether (PGME) and propylene glycol methyl ethyl acetate (PGMEA) in the mass ratio of 7/3.

Table 3 shows the results.

<Evaluation (2) of Organic Substance Residual Amount>

The organic substance residual amount was evaluated in the same manner as in <Evaluation (1) of organic substance residual amount> described above. Table 3 shows the results.

TABLE 3

|  | Amount of residual Sn | Residual organic substance |
|---|---|---|
| Comparative Example 4 | 100 | — |
| Example 7 | 9 | Absence |
| Example 8 | 52 | Absence |
| Example 9 | 16 | Absence |

From the results shown in Table 3, it was confirmed that in the cleaning liquids of Examples 7 to 9, the amount of residual Sn was smaller than that of the cleaning liquid of Comparative Example 4, showing favorable metal removing properties. It was also confirmed that in the cleaning liquids of Examples 7 to 9, the amount of residual organic substances was reduced.

<Evaluation of Zr Removing Properties>

1.2 g of an 80% 1-butanol solution of zirconium (IV) butoxide was added to a mixed solvent of 38 g of ethanol and 0.8 g of acetylacetone to prepare a zirconium hardmask precursor solution.

1.5 mL of the prepared zirconium hardmask precursor solution was applied onto a Si wafer, and a Zr-containing film was formed by spin coating under the application conditions of 2,000 rpm and 60 seconds.

Subsequently, 25 mL of the cleaning liquid of each of the examples was applied onto the Si wafer on which the Zr-containing film was formed, and the wafer was rotated at 500 rpm for 25 seconds until the cleaning liquid was dried. Thereafter, 5 mL of a mixed solution of propylene glycol methyl ether (PGME) and propylene glycol methyl ethyl acetate (PGMEA) in the mass ratio of 7/3 was applied to perform post-rinsing by rotating the wafer at 500 rpm for 60 seconds until the mixed solution was dried.

Subsequently, the amount of residual Zr ($\times 10^{10}$ atoms/cm$^2$) was measured by ChemTrace (registered trademark) using vapor phase decomposition-inductively coupled plasma-mass spectrometry (VPD-ICP-MS). With the amount of residual Zr in the cleaning liquid of Comparative Example 4 taken as a reference value of 100, the relative value was used for the evaluation of the amount of residual Zr. Table 4 shows the results.

TABLE 4

|  | Amount of residual Sn | Residual organic substance |
|---|---|---|
| Comparative Example 4 | 100 | Absence |
| Example 1 | 20 | Absence |

From the results shown in Table 4, it was confirmed that in the cleaning liquid of Example 1, the amount of residual Zr was smaller than that of the cleaning liquid of Comparative Example 4, showing favorable metal removing properties. It was also confirmed that in the cleaning liquid of Example 1, the amount of residual organic substances was reduced.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. A metal resist remover consisting of:
propylene glycol methyl ethyl acetate (PGMEA) in an amount of 98.5% to 99.5% with respect to a total mass of the metal resist remover; and
sulfuric acid in an amount of 0.5% to 1.5% by mass with respect to a total mass of the metal resist remover;
wherein a pH value, which is measured with a pH meter, of a liquid formed by subjecting the metal resist remover to a 10-fold dilution with pure water is 2.5 or less.

2. The metal resist remover according to claim 1, wherein the amount of sulfuric acid is from 0.5% to 1% by mass with respect to a total mass of the metal resist remover.

3. A metal resist remover consisting of:
PGMEA in an amount of 48% to 60% with respect to a total mass of the metal resist remover;
sulfuric acid in an amount of 0.4% to 2% by mass with respect to a total mass of the metal resist remover;
acetic acid in an amount from 31.6% to 39.5% with respect to a total mass of the metal resist remover; and
optionally water in an amount from 0.5% to 20% with respect to a total mass of the metal resist remover,
wherein a pH value, which is measured with a pH meter, of a liquid formed by subjecting the metal resist remover to a 10-fold dilution with pure water is 2.5 or less.

4. A method for removing metal edge beads from a circumferential edge portion of a support to which a metal resist is attached, comprising:
applying a metal resist remover according to claim 3 to the circumferential edge portion of the support, thereby removing the metal edge beads from the support.

5. The method according to claim 4, wherein the metal resist remover is applied dropwise.

6. The method according to claim 5, wherein an amount of the metal resist remover is 0.05 to 50 ml.

7. The method according to claim 4, wherein the metal resist remover is applied by spraying.

8. The method according to claim 7, wherein the spraying is for 1 second to 5 minutes.

9. The method according to claim 7, wherein the flow rate of the spraying is 5 ml/minute to 50 ml/minute.

* * * * *